(12) United States Patent
Lee et al.

(10) Patent No.: US 11,011,596 B2
(45) Date of Patent: May 18, 2021

(54) DISPLAY DEVICE

(71) Applicant: LG DISPLAY CO., LTD., Seoul (KR)

(72) Inventors: Seongku Lee, Paju-si (KR); Binn Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/595,059

(22) Filed: Oct. 7, 2019

(65) Prior Publication Data

US 2020/0111858 A1 Apr. 9, 2020

(30) Foreign Application Priority Data

Oct. 8, 2018 (KR) ........................ 10-2018-0119818

(51) Int. Cl.
*H01L 27/32* (2006.01)

(52) U.S. Cl.
CPC ...... *H01L 27/3276* (2013.01); *H01L 27/3246* (2013.01); *H01L 27/3258* (2013.01)

(58) Field of Classification Search
CPC ............. H01L 27/3246; H01L 27/3258; H01L 27/326; H01L 27/3276; H01L 51/5221; H01L 51/5225; H01L 51/5271; G09G 3/3233; G09G 3/3258
USPC .......................................................... 345/76
See application file for complete search history.

(56) References Cited

U.S. PATENT DOCUMENTS

| | | | | |
|---|---|---|---|---|
| 2002/0063515 A1* | 5/2002 | Goto | ................... | H01L 27/3258 313/500 |
| 2003/0201716 A1* | 10/2003 | Yamazaki | ............. | H01L 27/322 313/506 |
| 2009/0174320 A1* | 7/2009 | Kim | .................... | H01L 51/5271 313/504 |
| 2017/0005155 A1* | 1/2017 | You | ..................... | H01L 27/3258 |
| 2018/0151126 A1* | 5/2018 | Jeong | ................. | H01L 27/3276 |
| 2019/0131369 A1* | 5/2019 | Choi | .................. | H01L 27/3276 |
| 2019/0393442 A1* | 12/2019 | Miyamoto | .......... | H01L 51/5221 |
| 2020/0111858 A1* | 4/2020 | Lee | ..................... | H01L 51/5221 |
| 2020/0185470 A1* | 6/2020 | Son | ..................... | H01L 27/3246 |
| 2020/0203448 A1* | 6/2020 | Kim | ........................ | H01L 51/56 |

* cited by examiner

Primary Examiner — Dmitriy Bolotin
(74) Attorney, Agent, or Firm — Birch, Stewart, Kolasch & Birch, LLP

(57) ABSTRACT

A display device can include a plurality of sub-pixels including light emitting portions and circuit portions, and being configured to receive signals through vertical lines extending in a first direction and horizontal lines extending in a second direction intersecting the first direction; transistors disposed in the circuit portions; an overcoat layer covering the transistors; first electrodes disposed on the overcoat layer, each of the first electrodes being electrically connected to a corresponding light emitting portion among the light emitting portions and at least one of the transistors; a bank layer disposed on the first electrodes and including openings exposing the first electrodes; an open hole disposed in a region between two adjacent first electrodes among the first electrodes and penetrating through the bank layer; an organic compound layer disposed on the first electrodes; and a second electrode disposed on the organic compound layer and extending to an area inside of the open hole, in which the vertical lines and the horizontal lines are absent from the region between the two adjacent first electrodes.

19 Claims, 17 Drawing Sheets

DISPLAY DEVICE

CROSS REFERENCE TO RELATED APPLICATION

This application claims the priority benefit of Korean Patent Application No. 10-2018-0119818, filed in the Republic of Korea on Oct. 8, 2018, which is incorporated herein by reference for all purposes as if fully set forth herein.

BACKGROUND OF THE INVENTION

Field of the Invention

The present invention relates to a display device having a light-collecting structure.

Related Art

Recently, various display devices that are less bulky and more lightweight than cathode ray tubes (CRTs) are being developed. Examples of these display devices include liquid crystal displays (LCDs), field emission displays (FEDs), plasma display panels (PDPs), organic light-emitting display devices (OLEDs), etc.

Of these flat-panel displays, organic light-emitting displays are self-luminous displays that emit light through excitation of organic compounds. In contrast to LCDs, the organic light-emitting displays work without a backlight; thus, they can be more lightweight and thinner and made in a simpler process. Also, the organic light-emitting displays are widely used because they can be manufactured at low temperatures, have a fast response time of 1 ms or less, and feature low power consumption, wide viewing angle, and high contrast.

An organic light-emitting display includes organic light-emitting diodes which convert electrical energy into light energy. Each organic light-emitting diode includes an anode, a cathode, and an organic compound layer situated between the anode and cathode. Holes and electrons are injected from the anode and cathode, respectively, and they recombine in an emission layer to form excitons, whereby the organic light-emitting display displays an image when the excitons decay from the excited state to the ground state.

In recent years, efforts are being made to improve luminous efficiency in the optical design of organic light-emitting didoes. For example, conventional methods have been proposed to increase luminous efficiency by adjusting optical interference distances, such as properly matching the refractive indices of organic materials of an organic emission layer or adjusting the film thicknesses of organic films. However, because of the limitations of materials, there are substantial difficulties in improving luminous efficiency using out-coupling technology.

SUMMARY OF THE INVENTION

The present invention provides a display device that improves out-coupling efficiency.

The present invention provides a display device including a plurality of sub-pixels, transistors, an overcoat layer, first electrodes, a bank layer, open holes, an organic compound layer, and a second electrode. Each of the sub-pixels receives a preset signal through vertical lines extending in a first direction and horizontal lines extending in a second direction intersecting the first direction, and is divided up into an emitting portion and a circuit portion. The transistors are allocated to the circuit portions. The overcoat layer covers the transistors. The first electrodes are disposed on the overcoat layer, and are respectively allocated to the emitting portions and electrically connected to the transistors. The bank layer is disposed on the first electrodes, and has openings (e.g., open holes) exposing the first electrodes. The open holes are disposed between neighboring first electrodes, and penetrate the bank layer. The organic compound layer is disposed on the first electrodes. The second electrode is disposed on the organic compound layer, and is extended to the inside of the open holes. The vertical lines and the horizontal lines are not disposed between neighboring first electrodes, in areas where the open holes are formed.

BRIEF DESCRIPTION OF THE DRAWINGS

The accompanying drawings, which are included to provide a further understanding of the invention and are incorporated on and constitute a part of this specification, illustrate embodiments of the invention and together with the description serve to explain the principles of the invention. In the drawings.

DETAILED DESCRIPTION OF THE EMBODIMENTS

Figure 1:
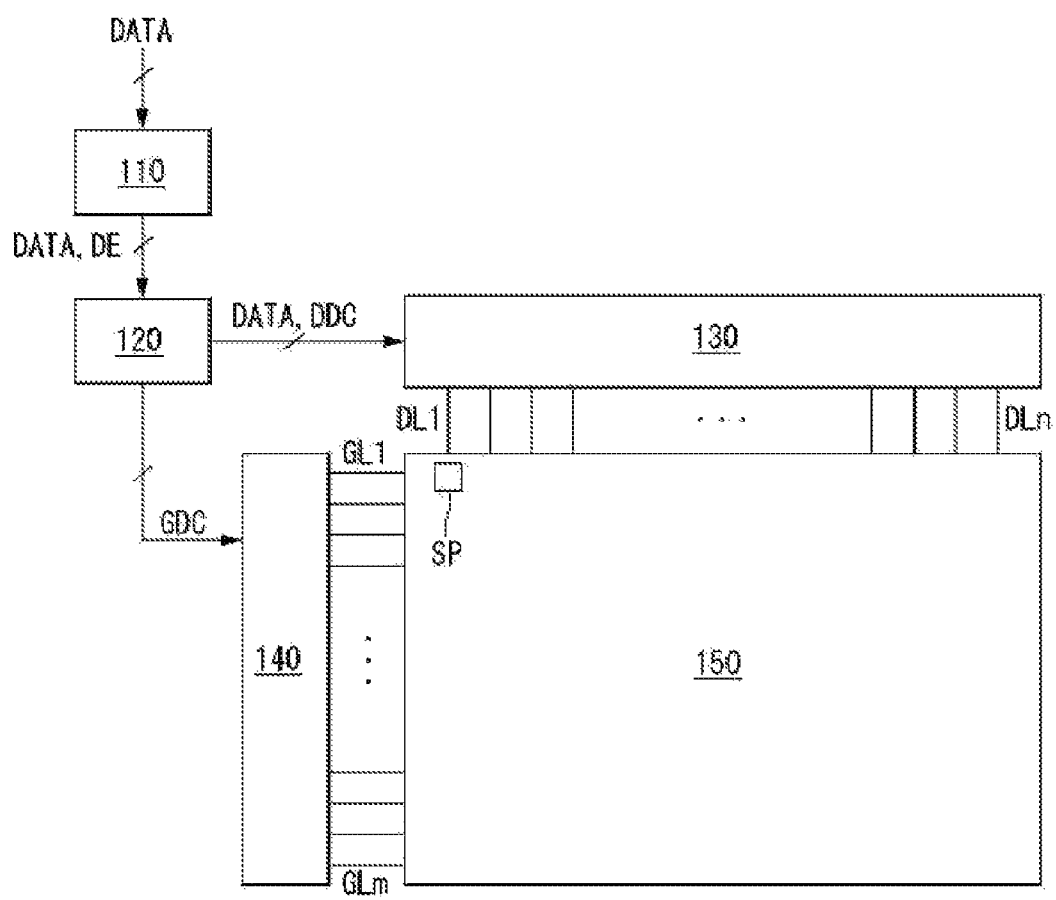
FIG. 1 is a schematic block diagram of an organic light-emitting display according to an embodiment.

Hereinafter, example embodiments of the present invention will be described in detail with reference to the attached drawings. Throughout the specification, like reference numerals denote substantially like components. In describing the present invention, a detailed description of known functions or configurations related to the present invention will be omitted when it is deemed that they may unnecessarily obscure the subject matter of the present invention. In describing various example embodiments, descriptions of the same or like components will be given in the beginning but omitted in other embodiments.

Although terms including ordinal numbers such as "first" and "second" may be used to describe various components, the components are not limited by the terms. The terms are used only to distinguish one component from other components.

Figure 2:
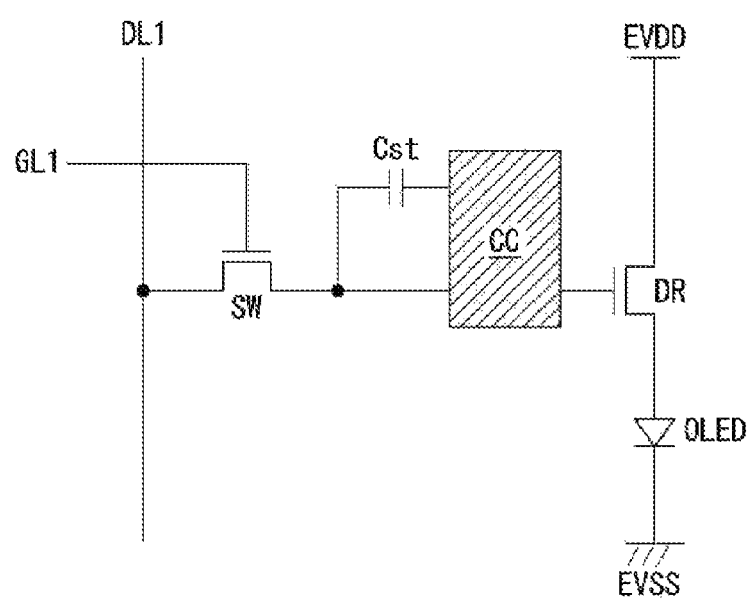
FIG. 2 is a schematic circuit diagram of a sub-pixel according to an embodiment.
Figure 3:
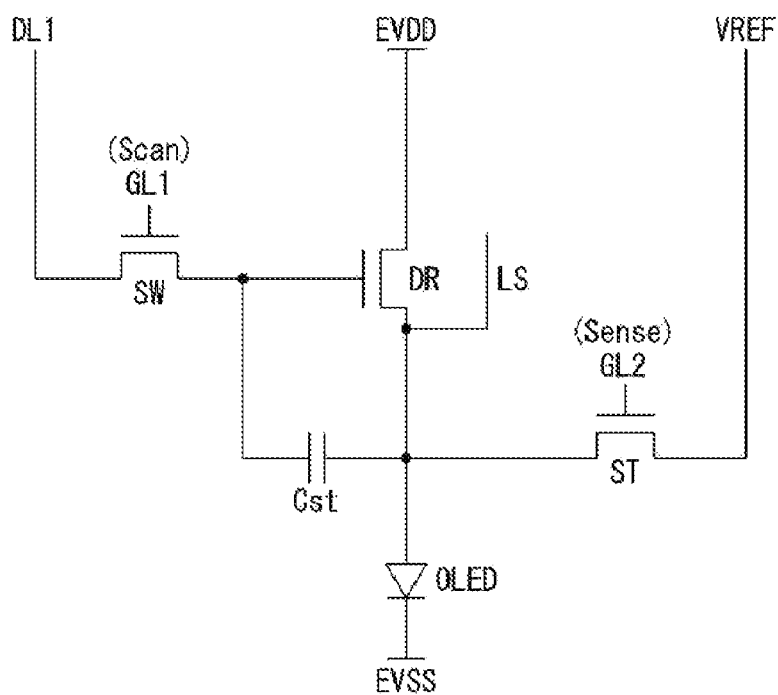
FIG. 3 illustrates a detailed circuit diagram of a sub-pixel according to an embodiment.
Figure 4:
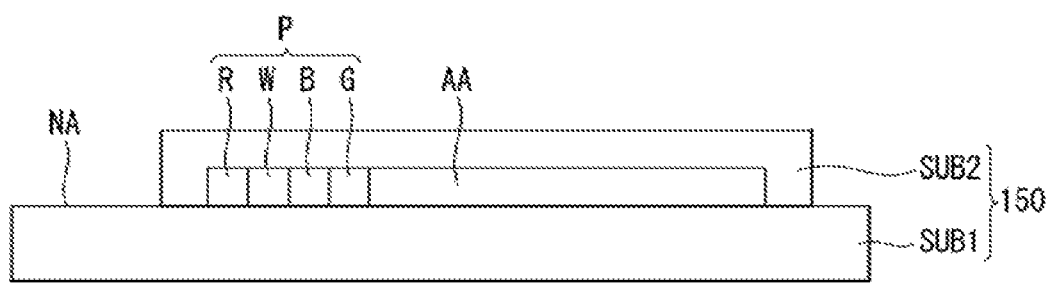
FIG. 4 illustrates a cross-sectional view of a display panel according to an embodiment.

FIG. 1 is a schematic block diagram of an organic light-emitting display. FIG. 2 is a schematic circuit diagram of a sub-pixel. FIG. 3 illustrates a detailed circuit diagram of a sub-pixel. FIG. 4 illustrates a cross-sectional view of a display panel.

As shown in FIG. 1, the organic light-emitting display includes an image processor 110, a timing controller 120, a data driver 130, a scan driver 140, and a display panel 150.

The image processor 110 outputs a data enable signal DE, etc., along with an externally supplied data signal DATA. The image processor 110 can output one or more among a vertical synchronization signal, horizontal synchronization signal, and clock signal, in addition to the data enable signal DE.

The timing controller 120 receives the data signal DATA from the image processor 110, along with the data enable signal DE or driving signals including the vertical synchronization signal, horizontal synchronization signal, and clock signal. Based on the driving signals, the timing controller 120 outputs a gate timing control signal GDC for controlling the operation timing of the scan driver 140 and a timing control signal DDC for controlling the operation timing of the data driver 130.

In response to the data timing control signal DDC supplied from the timing controller 120, the data driver 130 samples and latches the data signal DATA supplied form the timing controller 120, converts the data signal DATA to a gamma reference voltage, and outputs the gamma reference voltage. The data driver 130 outputs the data signal DATA through data lines DL1 to DLn. The data driver 130 can be formed in the form of an integrated circuit (IC).

In response to the gate timing control signal GDC supplied from the timing controller 120, the scan driver 140 outputs a scan signal. The scan driver 140 outputs the scan signal through gate lines GL1 to GLm. The scan driver 140 is formed in the form of an IC (integrated circuit), or is formed on the display panel 150 by a gate-in-panel (GIP) technology.

The display panel 150 displays an image, corresponding to the data signal DATA and scan signal respectively supplied from the data driver 130 and scan driver 140. The display panel 150 includes sub-pixels SP which work to display an image.

The sub-pixels SP include red sub-pixels, green sub-pixels, and blue sub-pixels, or include red sub-pixels, white sub-pixels, green sub-pixels, and blue sub-pixels. For convenience of explanation, the description below will be given of sub-pixels SP including red sub-pixels, white sub-pixels, green sub-pixels, and blue sub-pixels. The sub-pixels SP can have different emission areas depending on their emission characteristics.

As shown in FIG. 2, each sub-pixel includes a switching transistor SW, a driving transistor DR, a capacitor Cst, a compensation circuit CC, and an organic light emitting diode OLED.

In response to a scan signal supplied through the first gate line GL1, the switching transistor SW performs a switching operation so that a data signal supplied through the first data line DL1 is stored as a data voltage in the capacitor Cst. The driving transistor DR operates in such a way that a driving current flows between a power supply line EVDD (high-potential voltage) and a cathode power supply line EVSS (low-potential voltage) in response to the data voltage stored in the capacitor Cst. The organic light-emitting diode OLED operates in such a way as to emit light by the driving current formed by the driving transistor DR.

The compensation circuit CC is a circuit that is added into the sub-pixel to compensate for the threshold voltage, etc. of the driving transistor DR. The compensation circuit CC includes one or more transistors. The compensation circuit CC has a wide variety of configurations depending on the compensation method, and an example of this will be described below.

As shown in FIG. 3, the compensation circuit CC includes a sensing transistor ST and a sensing line VREF (or reference line). The sensing transistor ST is connected between a source electrode of the driving transistor DR and the anode (hereinafter, sensing node) of the organic light-emitting diode OLED. The sensing transistor ST operates to supply a reset voltage (or sensing voltage) delivered through the sensing line VREF to the sensing node of the driving transistor DR or to sense a voltage or current at the sensing node of the driving transistor DR or at the sensing line VREF.

A first electrode of the switching transistor SW is connected to the first data line DL1, and a second electrode of the switching transistor SW is connected to a gate electrode of the driving transistor DR. A first electrode of the driving transistor DR is connected to the power supply line EVDD, and a second electrode of the driving transistor DR is connected to the anode of the organic light-emitting diode OLED. A first electrode of the capacitor Cst is connected to the gate electrode of the driving transistor DR, and a second electrode of the capacitor Cst is connected to the anode of the organic light-emitting diode OLED. The anode of the organic light-emitting diode OLED is connected to the second electrode of the driving transistor DR, and the cathode of the organic light-emitting diode OLED is connected to the second power supply line EVSS. A first electrode of the sensing transistor ST is connected to the sensing line VREF, and a second electrode of the sensing transistor ST is connected to the anode of the organic light-emitting diode OLED and the second electrode of the driving transistor DR.

The operating time of the sensing transistor ST can be similar/identical to the operating time of the switching transistor SW according to an external compensation algorithm (or the configuration of the compensation circuit). For example, the gate electrode of the switching transistor SW can be connected to the first gate line GL1, and the gate electrode of the sensing transistor ST can be connected to the second gate line GL2. In this situation, a scan signal Scan is transmitted to the first gate line GL1, and a sensing signal Sense is transmitted to the second gate line GL2. In another example, the first gate line GL1 connected to the gate electrode of the switching transistor SW and the second gate line GL2 connected to the gate electrode of the sensing transistor ST can be connected to be shared in common.

The sensing line VREF can be connected to the data driver. In this situation, the data driver can sense the sensing node of the sub-pixel in real time, during an image non-display period, or for a period of N frames (N being an integer greater than or equal to 1) and generate a sensing result. Also, the switching transistor SW and the sensing transistor ST can be turned on at the same time. In this situation, a sensing operation through the sensing line VREF and a data output operation for outputting a data signal are distinguished from each other based on a time-division method of the data driver.

A digital data signal, an analog data signal, or a gamma voltage can be compensated for according to the sensing result. Also, a compensation circuit that generates a compensation signal (or compensation voltage) based on the sensing result can be implemented within the data driver, within the timing controller, or as a separate circuit.

A light shielding layer LS can be formed only under the channel region of the driving transistor DR, or can be formed under the channel regions of the switching transistor SW and sensing transistor ST, as well as under the channel region of the driving transistor DR. The light shielding layer LS can be used to simply block external light or can be used as an electrode that facilitates a connection to other electrodes or lines and constitutes a capacitor, etc. Therefore, the light shielding layer LS can be composed of multiple layers of metals (multiple layers of different metals) to have light shielding properties.

Although FIG. 3 illustrates an example in which each sub-pixel has a 3T (transistor) 1C (capacitor) structure including a switching transistor SW, a driving transistor DR, a capacitor Cst, an organic light-emitting diode OLED, and a sensing transistor ST, each sub-pixel can have other structures like 3T2C, 4T2C, 5T1C, 6T2C, etc. if the compensation circuit CC is added to the sub-pixel. The description bellow will be given with respect to the example depicted in FIG. 3.

As shown in FIG. 4, sub-pixels are formed in a display area AA of a substrate (or thin-film transistor substrate) SUB1, based on the circuit explained with reference to FIG. 3. The sub-pixels formed in the display area AA are encapsulated with a protective film (or encapsulation substrate) SUB2. The unexplained reference numeral NA denotes a non-display area. The substrate SUB1 can be made of glass or ductile material.

The sub-pixels are arranged horizontally or vertically in the display area AA, in the order red (R), white (W), blue (B), and green (G). A red sub-pixel R, a white sub-pixel W, a blue sub-pixel B, and a green sub-pixel G constitute a single pixel P. The arrangement sequence of these sub-pixels can vary with the light-emitting materials, the emission area, and the configuration (or structure) of the compensation circuit. Alternatively, a red sub-pixel R, a blue sub-pixel B, and a green sub-pixel G can constitute a single pixel P.

Figure 5:
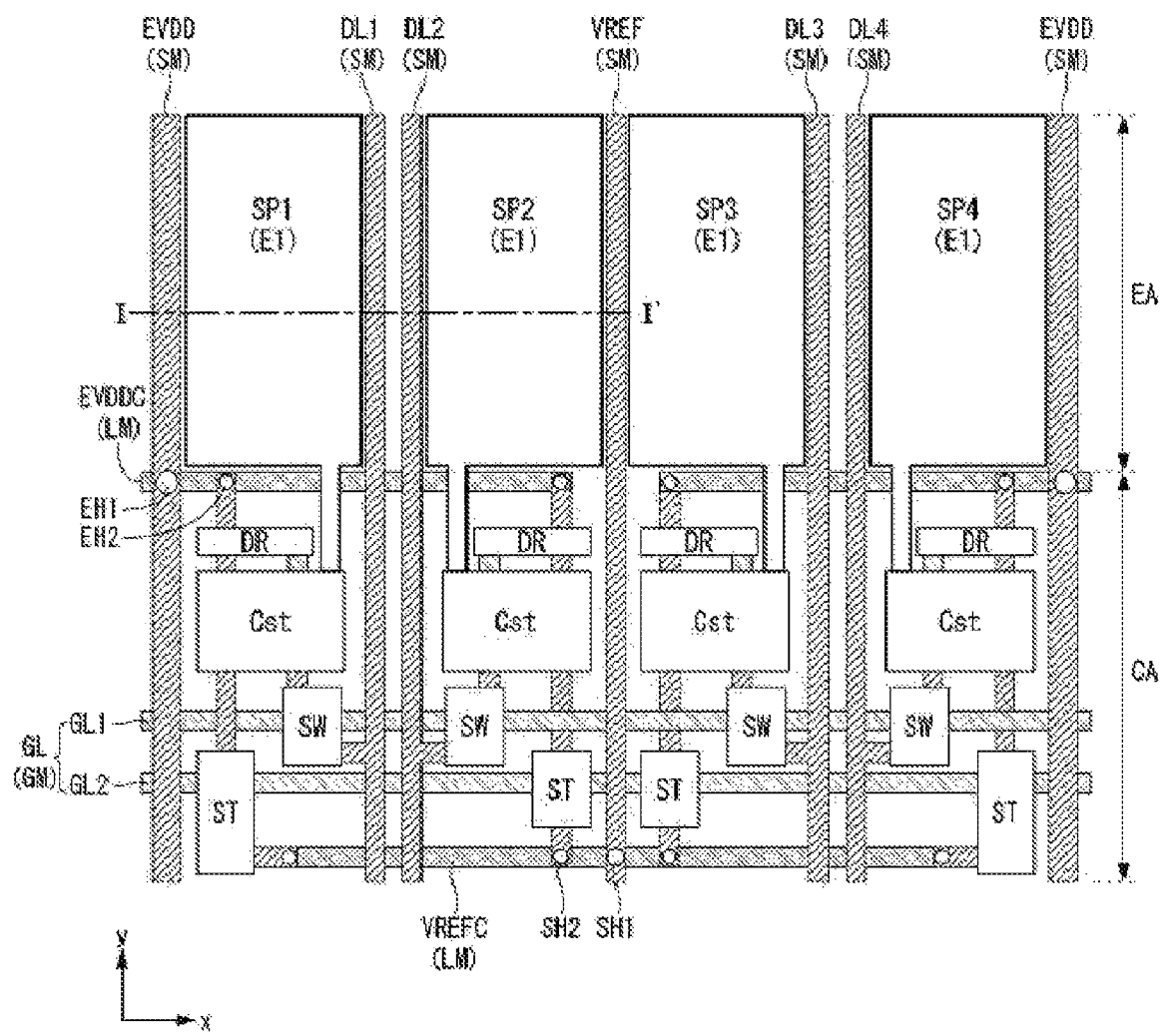
FIG. 5 is a plan view showing a display panel according to an embodiment of the present invention.
Figure 6:
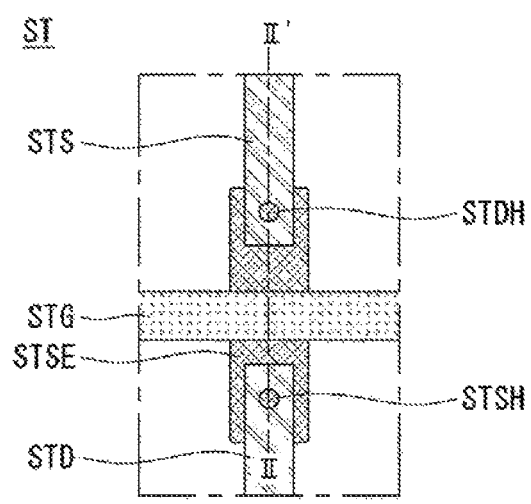
FIG. 6 is an enlarged plan view of a sensing transistor part in FIG. 5 according to an embodiment.
Figure 7:
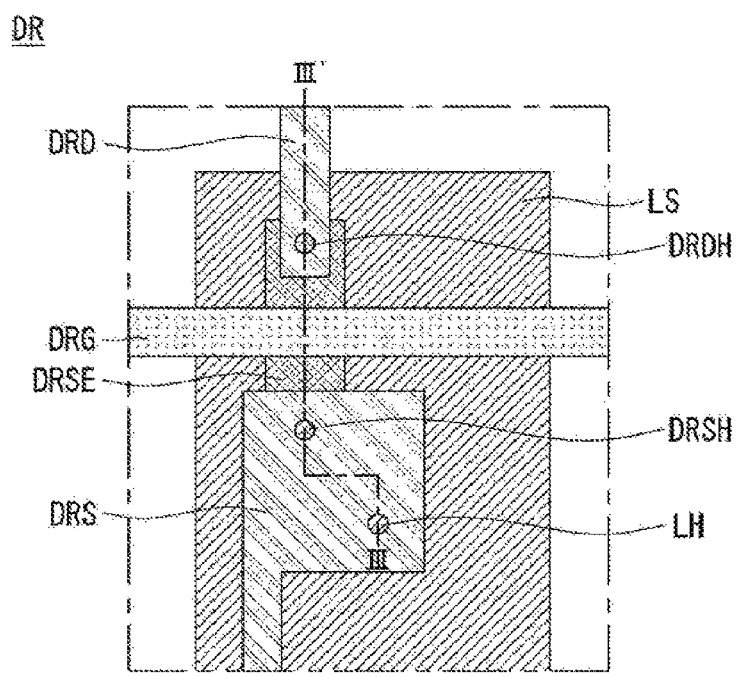
FIG. 7 is an enlarged plan view of a driving transistor part in FIG. 5 according to an embodiment.
Figure 8:
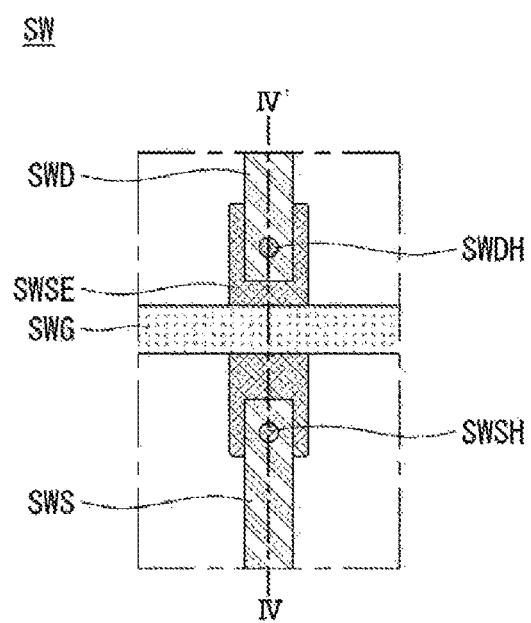
FIG. 8 is an enlarged plan view of a switching transistor part in FIG. 5 according to an embodiment.
Figure 9:
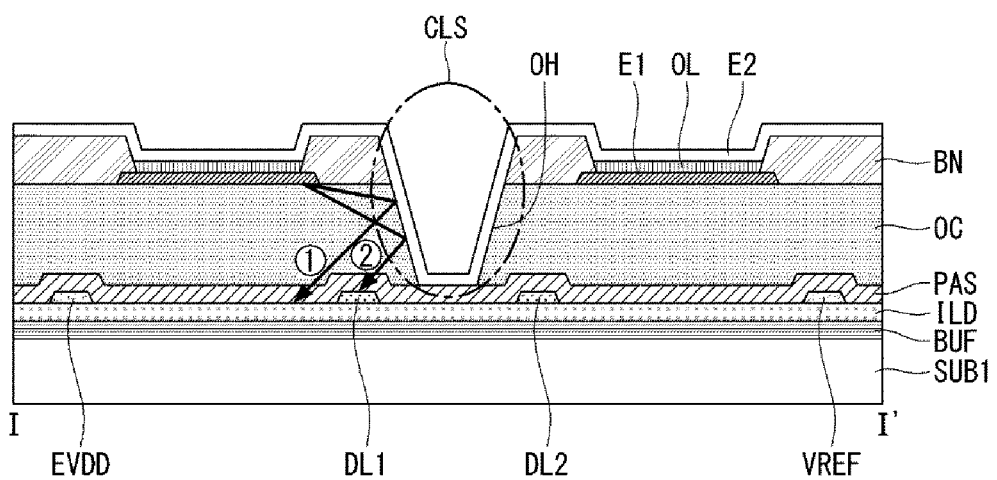
FIG. 9 is a cross-sectional view taken along the line I-I' in FIG. 5 according to an embodiment.
Figure 10:
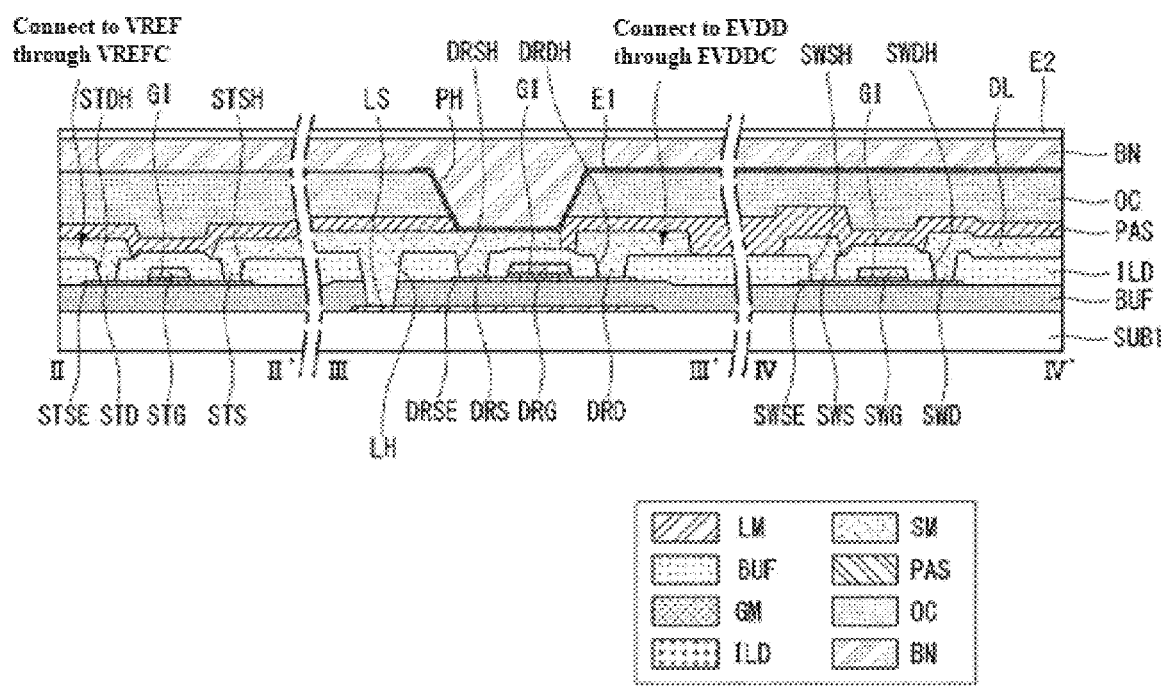
FIG. 10 is a cross-sectional view taken along the lines III-III', and IV-IV' in FIGS. 6 to 8 according to an embodiment.
Figure 11:
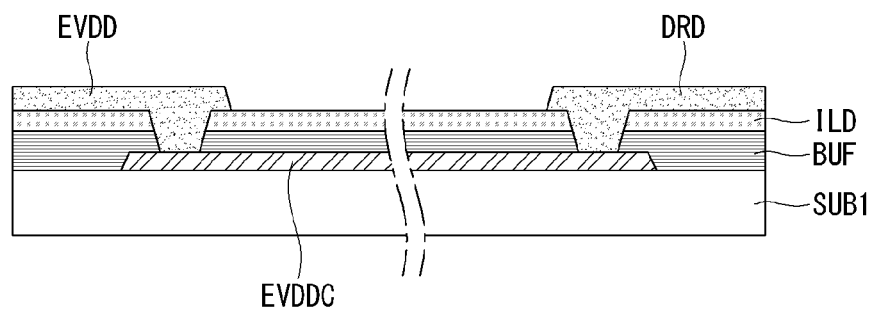
FIG. 11 is a cross-sectional view showing connections between a power supply line, a driving transistor, and a power supply link line according to an embodiment.
Figure 12:
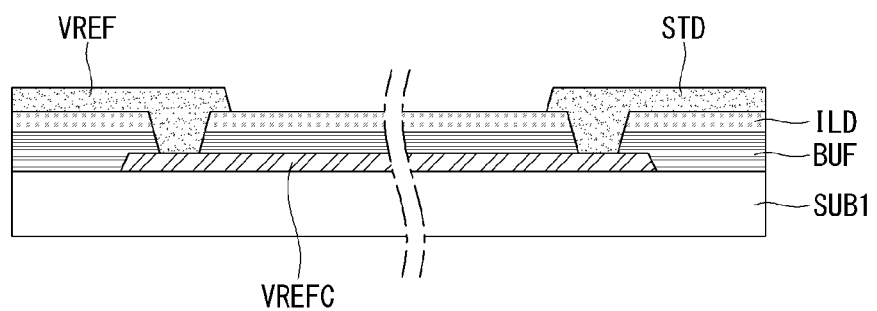
FIG. 12 is a cross-sectional view showing connections between a sensing line, a sensing transistor, and a sensing link line according to an embodiment.

FIG. 5 is a plan view showing a display panel according to a first embodiment of the present invention. FIG. 6 is an enlarged plan view of a sensing transistor part in FIG. 5. FIG. 7 is an enlarged plan view of a driving transistor part in FIG. 5. FIG. 8 is an enlarged plan view of a switching transistor part in FIG. 5. FIG. 9 is a cross-sectional view taken along the line I-I' in FIG. 5. FIG. 10 is a cross-sectional view taken along the lines and IV-IV' in FIGS. 6 to 8. FIG. 11 is a cross-sectional view showing connections between a power supply line, a driving transistor, and a power supply link line. FIG. 12 is a cross-sectional view showing connections between a sensing line, a sensing transistor, and a sensing link line.

Referring to FIG. 5 in conjunction with FIG. 3, pixels P are arranged in the display area AA of the substrate SUB1. Each pixel P includes sub-pixels SP1 to SP4 each including an emitting portion EA and a circuit portion CA. The sub-pixels SP1 to SP4 are arranged in a first direction (for example, along the X-axis). An organic light-emitting diode (light-emitting element) is formed in the emitting portion EA A circuit including a switching transistor SW, sensing transistor ST, and driving transistor DR that drive the organic light-emitting diode is formed in the circuit portion CA. In the first embodiment, the emitting portion EA and the circuit portion CA are arranged in a second direction (for example, along the Y-axis) intersecting the first direction. In each of the sub-pixels SP1 to SP4, the organic light-emitting diode located in the emitting portion EA emits light in response to operations of the switching and driving transistors DR located in the circuit portion CA.

Each pixel P includes horizontal lines and vertical lines, through which a driving signal is applied to the sub-pixels SP1 to SP4. The pixels P can share the predetermined horizontal lines and the predetermined vertical lines. The vertical lines are placed between neighboring sub-pixels SP1 to SP4.

The vertical lines can include a power supply line EVDD, a sensing line VREF, and first to fourth data lines DL1 to DL4. The vertical lines can refer to lines that stretch between sub-pixels SP1 to SP4 adjacent to each other in the first direction and extend in the second direction.

The horizontal lines can include a first gate line GL1 and a second gate line GL2. The horizontal lines can be disposed to intersect the vertical lines. The horizontal lines can refer to lines that extend in the first direction.

Lines such as the power supply line EVDD, sensing line VREF, first to fourth data lines DL1 to DL4 and electrodes forming the transistors can be disposed on the same layer or on different layers with one or more insulating layers interposed between them, and can be connected together via contact holes penetrating the insulating layer for electrical connections.

The first to fourth data lines DL1 to DL4 can be connected to the switching transistors SW of the corresponding sub-pixels SP. The first gate line GL1 can be connected to the switching transistors SW of the sub-pixels SP1 to SP4. The second gate line GL2 can be connected to the sensing transistors ST of the sub-pixels SP1 to SP4.

The power supply line EVDD can be connected to the driving transistors DR of the sub-pixels SP1 to SP4 through a power supply link line (or power supply jumping line) EVDDC. The power supply link line EVDDC is placed in the circuit portion CA. The power supply link line EVDDC extends in the first direction and delivers a signal from the power supply line EVDD extending in the second direction to the sub-pixels SP1 to SP4 arranged in the first direction. The power supply link line EVDDC and the power supply line EVDD are disposed on different layers, and are electrically connected via a first power supply contact hole EH1. The power supply link line EVDDC and the source electrode of the driving transistor DR are disposed on different layers, and are electrically connected via a second power supply contact hole EH2. Also, the driving transistor DR of the sub-pixel SP located adjacent to the power supply line EVDD can be connected directly to the power supply line EVDD without passing through the power supply link line EVDDC.

The sensing line VREF can be connected to the sensing transistors ST of the sub-pixels SP1 to SP4 through (or via) a sensing link line (or sensing jumping line) VREFC. The sensing link line VREFC is placed in the circuit portion CA. The sensing link line VREFC extends in the first direction and delivers a signal from the sensing line VREF extending in the second direction to the sub-pixels SP1 to SP4 arranged in the first direction. The sensing link line VREFC and the sensing line VREF are disposed on different layers, and are electrically connected via a first sensing contact hole SH1. The sensing link line VREFC and the source electrode of the sensing transistor ST are disposed on different layers, and are electrically connected via a second sensing contact hole SH2. Also, the sensing transistor ST of the sub-pixel SP located adjacent to the sensing line VREF can be connected directly to the sensing line VREF without passing through the sensing link line VREFC.

The first electrodes of the organic light-emitting diodes placed in the emitting portions EA of the sub-pixels SP1 to SP4 extend in the first direction where the circuit portions CA are arranged, and are electrically connected to the corresponding driving transistors DR and capacitors Cst.

More specifically, referring further to FIGS. 6 to 10, the display device according to embodiments of the present invention includes a substrate SUB1 where transistors and an organic light-emitting diode driven by the transistors are formed. The transistors can include a switching transistor SW, a driving transistor DR, and a sensing transistor ST.

A light shielding layer LS can be formed on the substrate SUB1 (e.g., see FIG. 7). The light shielding layer LS can be disposed to overlap at least the channel region, under a transistor. Although the drawing illustrates by way of example that the light shielding layer LS is formed only under the driving transistor DR, but it is not limited thereto. The aforementioned power supply link line EVDDC and sensing line VREFC are formed of the same material LM on the same layer as the light shielding layer LS.

A buffer layer BUF is formed on the light shielding layer LS. The buffer layer BUF can serve to block ions or impurities spreading from the substrate SUB1 and repel moisture from the outside.

The switching transistor SW, driving transistor DR, and sensing transistor ST are formed on the buffer layer BUF.

The switching transistor SW includes a switching semiconductor layer SWSE, a switching gate electrode SWG, a switching source electrode SWS, and a switching drain electrode SWD.

The switching semiconductor layer SWSE is disposed on the buffer layer BUF. The switching semiconductor layer SWSE can be divided up into a channel region, a source region provided at one side of the channel region, and a drain region provided at the other side of the channel region.

The switching gate electrode SWG is disposed over the channel region of the switching semiconductor layer SWSE, with a gate insulating layer GI interposed between them. The switching gate electrode SWG can be a part of the first gate line GL1 or a part branching from the first gate line GL1. That is, the switching gate electrode SWG and the first gate line GL1 are formed of the same material GM on the same layer.

An interlayer insulating layer ILD is disposed on the switching gate electrode SWG. The gate insulating layer GI and the interlayer insulating layer ILD can be composed of a silicon oxide film SiOx or a silicon nitride film SiNx, but are not limited thereto.

The switching source electrode SWS and the switching drain electrode SWD are disposed on the interlayer insulating layer ILD, spaced apart from each other. The switching source electrode SWS is connected to the source region of the switching semiconductor layer SWSE via a switching source contact hole SWSH penetrating the interlayer insulating layer ILD. The switching drain electrode SWD is connected to the drain region of the switching semiconductor layer SWSE via a switching drain contact hole SWDH penetrating the interlayer insulating layer ILD.

A data line DL can be formed of the same material SM on the same layer as the source and drain electrodes of the transistors. The switching drain electrode SWD can be a part of the data line DL or a part branching from the data line DL.

The driving transistor DR includes a driving semiconductor layer DRSE, a driving gate electrode DRG, a driving source electrode DRS, and a drain electrode DRD.

The driving semiconductor layer DRSE is disposed on the buffer layer BUF. The driving semiconductor layer DRSE can be divided up into a channel region, a source region provided at one side of the channel region, and a drain region provided at the other side of the channel region.

The driving gate electrode DRG is disposed over the channel region of the driving semiconductor layer DRSE, with the gate insulating layer GI interposed between them. The driving gate electrode DRG is electrically connected to the switching source electrode SWS of the switching transistor SW and supplied with signals from it. The interlayer insulating layer ILD is disposed on the driving gate electrode DRG.

The driving source electrode DRS and the driving drain electrode DRD are disposed on the interlayer insulating layer ILD, spaced apart from each other. The driving source electrode DRS is connected to the source region of the driving semiconductor layer DRSE via a driving source contact hole DRSH penetrating the interlayer insulating layer ILD. The driving drain electrode DRD is connected to the drain region of the driving semiconductor layer DRSE via a driving drain contact hole DRDH penetrating the interlayer insulating layer ILD. The driving source electrode DRS can be connected to the light shielding layer LS via a contact hole LH penetrating the interlayer insulating layer ILD and buffer layer BUF.

The power supply line EVDD can be formed of the same material SM on the same layer as the source and drain electrodes of the transistors. Referring further to FIG. 11, the driving drain electrode DRD is electrically connected to the power supply line EVDD. The driving drain electrode DRD can be connected to the power supply line EVDD through the power supply link line EVDDC. One end and the other end of the power supply link line EVDDC can be connected to the driving drain electrode DRD and the power supply line EVDD, respectively, via the first and second power supply contact holes EH1 and EH2 penetrating the buffer layer BUF and interlayer insulating layer ILD.

The sensing transistor ST includes a sensing semiconductor layer STSE, a sensing gate electrode STG, a sensing source electrode STS, and a sensing drain electrode STD.

The sensing semiconductor layer STSE is disposed on the buffer layer BUF. The sensing semiconductor layer STSE can be divided up into a channel region, a source region provided at one side of the channel region, and a drain region provided at the other side of the channel region.

The sensing gate electrode STG is disposed over the channel region of the sensing semiconductor layer STSE, with the gate insulating layer GI interposed between them. The sensing gate electrode STG can be a part of the second gate line GL2 or a part branching from the second gate line GL2. That is, the sensing gate electrode STG and the second gate line GL2 are formed of the same material GM on the same layer. The interlayer insulating layer ILD is disposed on the sensing gate electrode STG.

The sensing source electrode STS and the sensing drain electrode STD are disposed on the interlayer insulating layer ILD, spaced apart from each other. The sensing source electrode STS is connected to the source region of the sensing semiconductor layer STSE via a sensing source contact hole STSH penetrating the interlayer insulating layer ILD. The sensing drain electrode STD is connected to the drain region of the sensing semiconductor layer STSE via a sensing drain contact hole STDH penetrating the interlayer insulating layer ILD.

The sensing line VREF can be formed of the same material SM on the same layer as the source and drain electrodes of the transistors. Referring to FIG. 12, the sensing drain electrodes STD is electrically connected to the sensing line VREF. The sensing drain electrode STD can be connected to the sensing line VREF through the sensing link line VREFC. One end and the other end of the sensing link line VREFC can be connected to the sensing drain electrode STD and the sensing line VREF, respectively, via the first and second sensing contact holes SH1 and SH2 penetrating the buffer layer BUF and interlayer insulating layer ILD (e.g., see FIG. 5).

A passivation layer PAS is formed on the substrate where the switching transistor SW, driving transistor DR, and sensing transistor ST are formed. The passivation layer PAS is an insulating film that protects the underlying elements, and can be a silicon oxide film (SiOx), a silicon nitride film (SiNx), or multiple layers of these compounds. An overcoat layer OC is disposed on the passivation layer PAS. The overcoat layer OC can be a planarization film for smoothing out step differences on the underlying structure, and is made of an organic material such as polyimide, benzocyclobutene-based resin, acrylate, etc. If desired, either the passivation layer PAS or the overcoat layer OC may be omitted.

An organic light-emitting diode OLED is disposed on the overcoat layer OC. The organic light-emitting diode includes a first electrode E1, an organic compound layer OL, and a second electrode E2 which face one another.

The first electrode E1 can be an anode. The first electrode E1 is connected to the driving source electrode DRS of the driving transistor DR via a pixel contact hole PH penetrating the overcoat layer OC and passivation layer PAS. Since the display device according to embodiments of the present invention is made to be bottom-emitting, the first electrode E1 can function as a transmissive electrode. In an example, the first electrode E1 can be made of a transparent conductive material, such as ITO (indium tin oxide), IZO (indium zinc oxide), or ZnO (zinc oxide).

A bank layer BN is disposed on the substrate SUB1 where the first electrode E1 is formed. The bank layer BN can be made of an organic material such as polyimide, benzocyclobutene-based resin, acrylate, etc.

The bank layer BN includes an opening portion exposing most of the first electrode E1. The bank layer BN can be disposed to expose the center of the first electrode E1 and cover the side edge of the first electrode E1. The center of the first electrode E1 exposed through the opening in the bank layer BN can be defined as a light-emitting portion.

The organic compound layer OL is disposed on the substrate SUB1 where the bank layer BN is formed. The organic compound layer OL is a layer that emits light by the recombination of electrons and holes, and includes an emission layer EML and can further include one or more among a hole injection layer HIL, a hole transport layer HTL, an electron transport layer ETL, and an electron injection layer EIL.

The second electrode E2 is disposed on the organic compound layer OL. The second electrode E2 can be formed widely across the entire surface of the substrate SUB1. Since the display device according to embodiments of the present invention is made to be bottom-emitting, the second electrode E2 can function as a reflective electrode. For example, the second electrode E2 can be made of a reflective material, such as magnesium (Mg), calcium (Ca), aluminum (Al), silver (Ag), or an alloy thereof which has a low work function.

The display device according to the first embodiment of the present invention includes a light-collecting structure CLS for improving out-coupling efficiency. The light-collecting structure CLS includes an open hole OH and a second electrode E2 disposed in the open hole OH.

The open hole OH is disposed between first electrodes E1 adjacent to each other in the first direction (e.g., the open hole is between two adjacent subpixels). The open hole OH can be formed to penetrate one or more of the insulating films between the second electrode E2 and the substrate SUB1. The open hole OH can penetrate down sequentially from the bank layer BN. That is, the drawing illustrates by way of example that the open hole OH penetrates the bank layer BN and the overcoat layer OC, but it is not limited thereto.

At least part of the second electrode E2 extends to the inside of the open hole OH. That is, the second electrode extends as it covers the top surfaces of the organic compound layer OL and bank layer BN, and a part thereof is received in the open hole OH. Also, the second electrode E2 can extend all the way across the open hole OH from one subpixel to another adjacent subpixel.

The part of the second electrode E2 located in the open hole OH allows incident light to change the direction of travel to a preset direction (e.g., the part of the second electrode E2 in the open hole OH can act like a funnel or reflector, in order to redirect light out through the bottom of the substrate, which otherwise would be trapped or internally reflected inside the device or emitted to the side and mixed with an adjacent subpixel's light). The direction of orientation can be a direction toward the bottom of the substrate SUB1, or a direction toward a color filter if any. That is, in the display device according to the first embodiment of the present invention, a part of the second electrode E2 inserted into the open hole OH can be used so that a beam of light (①) of FIG. 9) (e.g., light that travels toward the side and causes color mixing or gets lost) that does not travel in the direction of orientation can easily change its path toward the bottom, among the light provided from the organic compound layer OL, or so that any light that may otherwise be lost between the interfaces of the thin-film layers can be easily coupled out in the direction of the bottom towards the viewer's eyes.

Accordingly, the first embodiment of the present invention has the advantage of significantly improving luminous efficiency. Another advantage of the first embodiment of the present invention has the advantage of reducing color mixing defects because unwanted light traveling toward neighboring pixels can be eliminated or minimized.

In addition, in the first embodiment of the present invention, as shown in FIGS. 5 and 9, in an area where a light-collecting structure CLS is formed, a power supply line EVDD, sensing line VREF, and data lines D1 to D4 extending in the first direction can be placed between first electrodes E1 adjacent to each other in the first direction, and a sensing link line VREFC extending in the first direction can be placed between first electrodes E1 adjacent to each other in the second direction. In this situation, the signal lines placed in the corresponding area may block the path of light ② diverted by the light-collecting structure CLS and traveling in the direction of orientation. These signal lines may be a factor that lowers light efficiency, which can be improved (e.g., the data lines may get in the way of some of the light that has been redirected by the light-collecting structure CLS).

Figure 13:
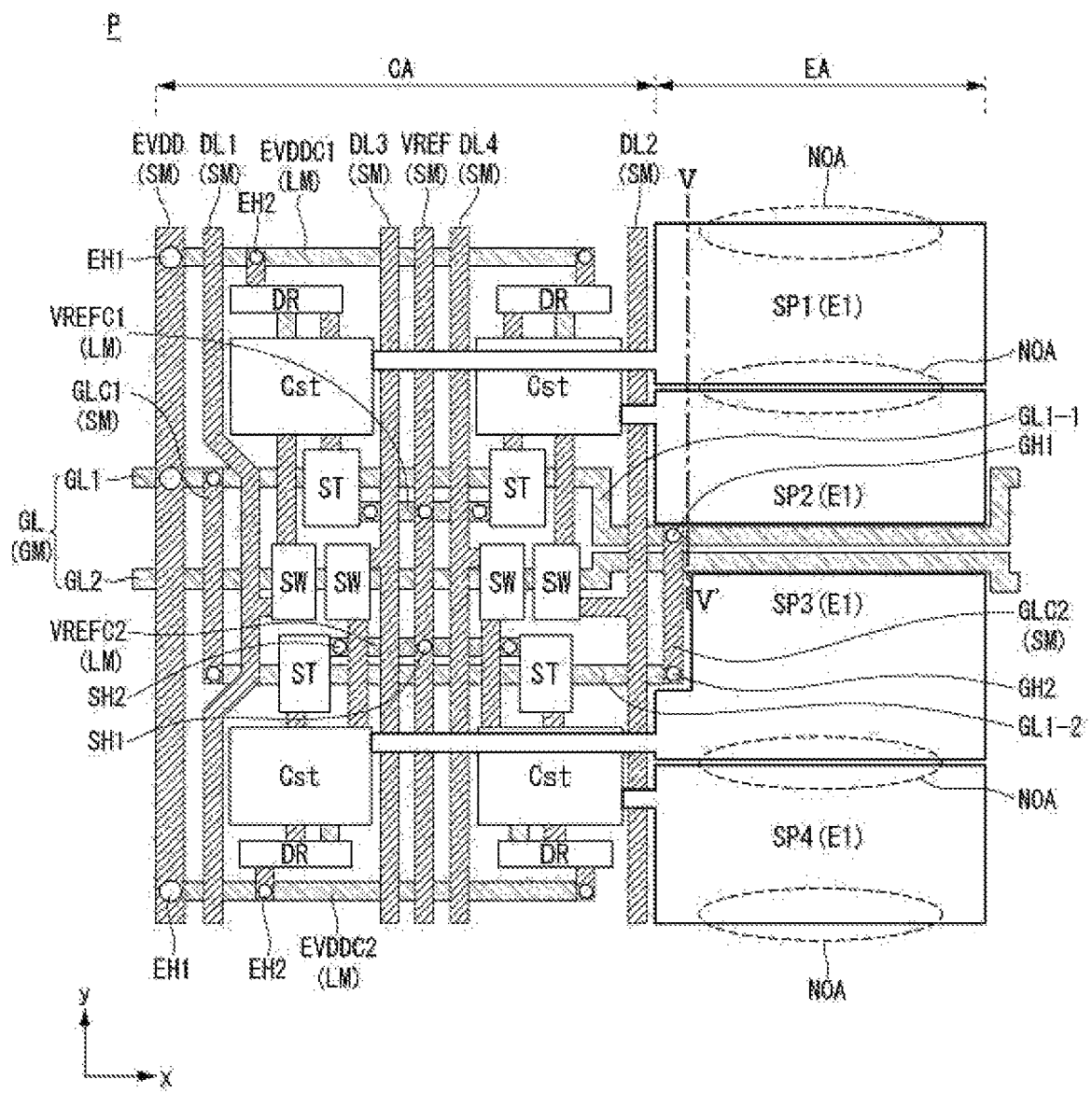
FIG. 13 is a plan view showing a display panel according to another embodiment of the present invention according to an embodiment.
Figure 14:
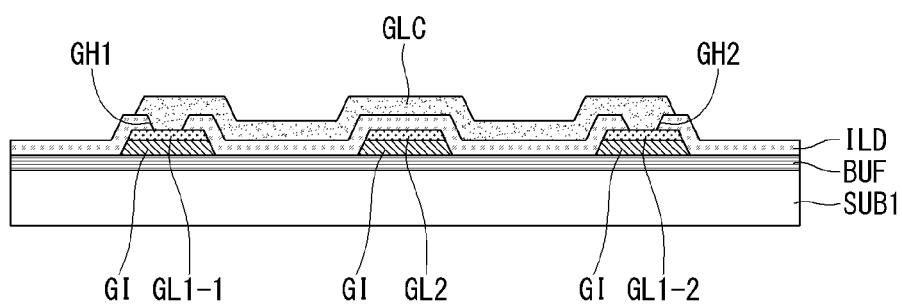
FIG. 14 is a cross-sectional view showing a connection between a gate line and a gate link line according to an embodiment.
Figure 15:
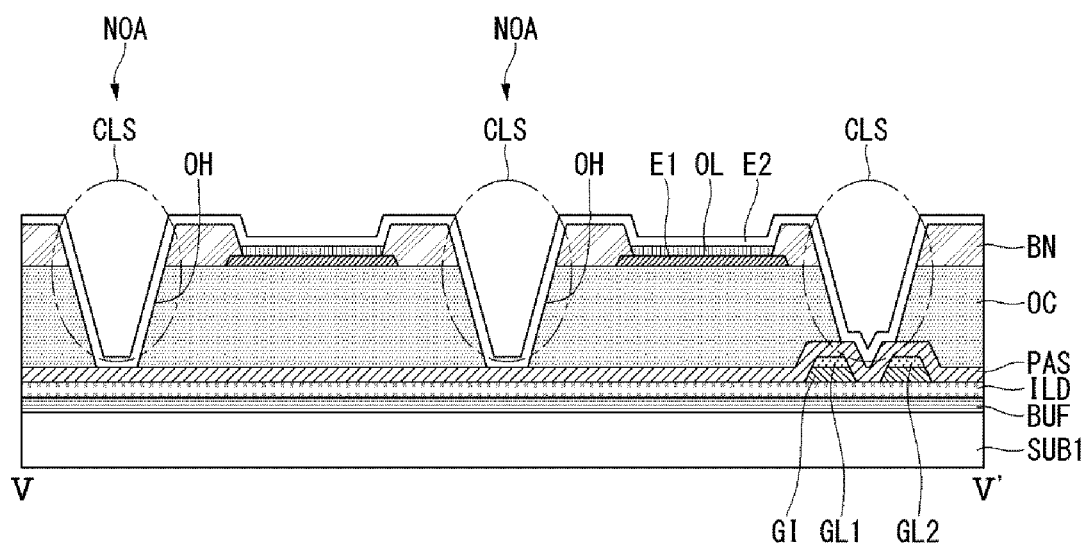
FIG. 15 is a cross-sectional view taken along the line V-V' in FIG. 13 according to an embodiment.

FIG. 13 is a plan view showing a display panel according to a second embodiment of the present invention. FIG. 14 is a cross-sectional view showing a connection between a gate line and a gate link line. FIG. 15 is a cross-sectional view taken along the line V-V' in FIG. 13. In describing the second embodiment, an explanation of components substantially identical to those of the first embodiment will be omitted.

Referring to FIG. 13 in conjunction with FIG. 3, pixels P are arranged in the display area AA of the substrate SUB1. Each pixel P includes sub-pixels SP1 to SP4 each including an emitting portion EA and a circuit portion CA. An organic light-emitting diode (light-emitting element) is formed in the emitting portion EA, and a circuit including a switching transistor SW, sensing transistor ST, and driving transistor DR that drive the organic light-emitting diode is formed in the circuit portion CA. In each of the sub-pixels SP1 to SP4, the organic light-emitting diode located in the emitting portion EA emits light in response to operations of the switching and driving transistors DR located in the circuit portion CA.

In the second embodiment, the circuit portions CP1 to CP4 of the sub-pixels SP1 to SP4 are placed on one side with respect to a virtual axis along the second direction. The emitting portions EP1 to EP4 of the sub-pixels SP1 to SP4 are placed on the other side with respect to the virtual axis along the second direction.

Specifically, the circuit portion CP1 of the first sub-pixel SP1 and the circuit portion CP2 of the second sub-pixel SP2 are placed adjacent to each other in the first direction. The circuit portion CP3 of the third sub-pixel SP3 and the circuit portion CP4 of the fourth sub-pixel SP4 are placed adjacent to each other in the first direction. The circuit portion CP1 of the first sub-pixel SP1 and the circuit portion CP3 of the third sub-pixel SP3 are placed adjacent to each other in the second direction. The circuit portion CP2 of the second sub-pixel SP2 and the circuit portion CP4 of the fourth sub-pixel SP4 are placed adjacent to each other in the second direction.

The emitting portion EP1 of the first sub-pixel SP1, the emitting portion EP2 of the second sub-pixel SP2, the emitting portion EP3 of the third sub-pixel SP3, and the emitting portion EP4 of the fourth sub-pixel SP4 are arranged sequentially in the second direction.

Each pixel P includes horizontal lines and vertical lines, through which a driving signal is applied to the sub-pixels SP1 to SP4. The pixels P can share the horizontal lines and the vertical lines.

The vertical lines can include a power supply line EVDD, a sensing line VREF, and first to fourth data lines DL1 to DL4. The vertical lines are all placed on one side of the first electrodes E1 of the sub-pixels SP1 to SP4. Thus, the vertical lines are not placed on the other side of the first electrodes E1 of the sub-pixels SP1 to SP4. The vertical lines can refer to lines that extend in the second direction. For example, nearly all of the wiring lines and circuit components can all be located on the same side and spaced away from the light emitting areas of the subpixels within a unit pixel, as shown in FIG. 13 (e.g., wires and circuit components on the left half, and light emitting areas on the right half).

The first to fourth sub-pixels SP1 to SP4 can share one sensing line VREF and one power supply line EVDD.

The sensing line VREF can be connected to the sensing transistors ST of the sub-pixels SP1 to SP4 through a sensing link line VREFC. The sensing link line VREFC is placed in the circuit portion CA. The sensing link line VREFC extends in the first direction and delivers a signal from the sensing line VREF extending in the second direction to the sub-pixels SP1 to SP4 arranged in the first direction. The sensing link line VREFC and the sensing line VREF are disposed on different layers, and are electrically connected via a first sensing contact hole SH1. The sensing link line VREFC and the source electrode of the sensing transistor ST are disposed on different layers, and are electrically connected via a second sensing contact hole SH2.

The sensing link line VREFC includes a first sensing link line VREFC1 and a second sensing link line VREFC2. The first sensing link line VREFC1 is connected to the first and second sub-pixels SP1 and SP2 adjacent to each other in the first direction, and delivers a signal from the sensing line VREF to the first sub-pixel SP1 and the second sub-pixel SP2. The second sensing link line VREFC2 is connected to the third and fourth sub-pixels SP3 and SP4 adjacent to each other in the first direction, and delivers a signal from the sensing line VREF to the third sub-pixel SP3 and the fourth sub-pixel SP4.

The power supply line EVDD can be connected to the driving transistors DR of the sub-pixels SP1 to SP4 through a power supply link line EVDDC. The power supply link line EVDDC is placed in the circuit portion CA. The power supply link line EVDDC extends in the first direction and delivers a signal from the power supply line EVDD extending in the second direction to the sub-pixels SP1 to SP4 arranged in the first direction. The power supply link line EVDDC and the power supply line EVDD are disposed on different layers, and are electrically connected via a first power supply contact hole EH1. The power supply link line EVDDC and the source electrode of the driving transistor DR are disposed on different layers, and are electrically connected via a second power supply contact hole EH2.

The power supply link line EVDDC includes a first power supply link line EVDDC1 and a second power supply link line EVDDC2. The first power supply link line EVDDC1 is connected to the first and second sub-pixels SP1 and SP2 adjacent to each other in the first direction, and delivers a signal from the power supply line EVDD to the first sub-pixel SP1 and the second sub-pixel SP2. The second power supply link line EVDDC2 is connected to the third and fourth sub-pixels SP3 and SP4 adjacent to each other in the first direction, and delivers a signal from the power supply line EVDD to the third sub-pixel SP3 and the fourth sub-pixel SP4.

The first to fourth data lines DL1 to DL4 can be connected to the switching transistors SW of the corresponding sub-pixels SP. The first and third data lines DL1 and DL3 are placed apart from each other, with the circuit portions CA of the first and third sub-pixels SP1 and SP3 interposed between them. The second and fourth data lines DL2 and DL4 are placed apart from each other, with the circuit portions CA of the second and fourth sub-pixels SP2 and SP4 interposed between them.

Since the first sensing link line VREFC1, second sensing link line VREFC2, first power supply link line EVDDC1, and second power supply link line EVDDC2 which extend in the first direction intersect the sensing line VREF, power supply line EVDD, and data lines DL3 and DL4 which extend in the second direction, they are placed on different layers, with at least one insulating layer interposed between them, in order to prevent a short.

For example, as shown in the drawings, the first sensing link line VREFC1 and the second sensing link line VREFC2 can be placed on a corresponding layer of the same material LM as the light shielding layer, the first power supply link line EVDDC1 and the second power supply link line EVDD2 can be placed on a corresponding layer of the same material GM as the gate electrodes, and the sensing line VREF, the power supply line EVDD, and the data lines DL3 and DL4 can be placed on a corresponding layer of the same material SM as the source/drain electrodes.

In another example, the first sensing link line VREFC1, second sensing link line VREFC2, first power supply link line EVDDC1, and second power supply link line EVDDC2 can be formed of the same material since they do not intersect each other. For example, the first sensing link line VREFC1, second sensing link line VREFC2, first power supply link line EVDDC1, and second power supply link line EVDDC2 can be all formed of either the same material LM as the light shielding layer or the same material GM as the gate electrodes.

In another example, if the sensing line VREF is on a different layer from the power supply line EVDD and the first and second gate lines GL1 and GL2—for example, the sensing line VREF is formed on a corresponding layer of the same material LM as the light shielding layer, the sensing link line VREFC can be integral with the sensing line VREF. That is, the sensing link line VREFC can be a part branching from the sensing line VREF.

The horizontal lines can include a first gate line GL1 and a second gate line GL2. The horizontal lines can be disposed to intersect the vertical lines. All the horizontal lines (e.g., GL1 and GL2 in FIG. 13) are placed between the second sub-pixel SP2 and third sub-pixel SP3 adjacent to each other in the second direction. Thus, the horizontal lines are not placed between the first sub-pixel SP1 and the second sub-pixel SP2 and between the third sub-pixel SP3 and the fourth sub-pixel SP4. The horizontal lines can refer to lines that extend in the first direction.

The first gate line GL1 and the second gate line GL2 extend in the first direction. The first gate line GL1 and the second gate line GL2 can apply a signal to the first and third sub-pixels SP1 and SP3 neighboring in the second direction and the second and fourth sub-pixels SP2 and SP4 neighboring in the second direction. Thus, one of the first gate line GL1 and second gate line GL2 may intersect the other.

Here, since the first gate line GL1 and the second gate line GL2 are formed of the same material GM, at least one of the first and second gate lines GL1 and GL2 can be divided up into two parts, and the two parts can be connected via a gate link line.

For example, the first gate line GL1 can include a (1-1)th gate line GL1-1 and a (1-2)th gate line GL1-2 which are placed on opposite sides, with the second gate line GL2 interposed between them. The (1-1)th gate line GL1-1 is connected to the sensing transistors of the first sub-pixel SP1 and second sub-pixel SP2. The (1-2)th gate line GL1-2 is connected to the sensing transistors of the third sub-pixel SP3 and fourth sub-pixel SP4. The (1-1)th gate line GL1-1 and the (1-2)th gate line GL1-2 are connected by gate link lines GLC1 and GLC2. That is, referring to FIG. 14, the (1-1)th and (1-2)th gate lines GL1-1 and GL1-2 are disposed on a different layer from the gate link line GLC, and one end and the other end of the gate link line GLC are connected to the (1-1)th gate line GL1-1 and the (1-2)th gate line GL1-2, respectively, via first and second gate contact holes GH1 and GH2. The gate link line GLC is disposed on a different layer from the second gate line GL2, and extends in the second direction and intersects the second gate line GL2.

The first electrodes E1 of the organic light-emitting didoes placed in the emitting portions EA of the sub-pixels SP1 to SP4 extend in the first direction where the circuit portions CA are located, and are electrically connected to the corresponding driving transistors DR and capacitors Cst. The first electrodes E1 of the first and third sub-pixels SP1 and SP3 can be electrically connected to the corresponding driving transistors DR and capacitors Cst, across the circuit portions CA of the second and fourth sub-pixels SP2 and SP4.

In the second embodiment, with the above-described structure, no signal line is placed between first electrodes E1 adjacent to each other in at least one area. For example, no signal lines are placed between first and second sub-pixels SP1 and SP2 adjacent to each other in the second direction and no signal lines are placed between third and fourth sub-pixels SP3 and SP4 adjacent to each other in the second direction. For example, as shown in FIG. 13, there are no signal lines in the way that could potentially block light in the area between adjacent subpixels SP1 and SP2, and adjacent subpixels SP3 and SP4. Rather, this area in between these adjacent subpixels is free of signal lines.

Referring to FIG. 15, the display device according to the second embodiment of the present invention includes a light-collecting structure CLS formed between neighboring first electrodes E1. The light-collecting structure CLS includes an open hole OH and a second electrode E2 received in the open hole OH.

The part of the second electrode E2 located in the open hole OH allows incident light to change the direction of travel to a preset direction. The direction of orientation can be a direction toward the bottom of the substrate SUB1, or a direction toward a color filter if any. That is, in the display device according to the second embodiment of the present invention, a part of the second electrode E2 inserted into the open hole OH can be used so that a beam of light that does not travel in the direction of orientation can easily change its path toward the bottom, or so that any light that may otherwise get lost between the interfaces of the thin-film layers can be easily coupled out in the direction of the bottom towards the viewer's eyes.

In the second embodiment, unlike the first embodiment, at least one area NOA is provided where no signal line is placed between neighboring first electrodes E1 (e.g., signal lines are absent from the area NOA where a light-collecting structure CLS is disposed, so that the redirected light does not get blocked by such signal lines because signal lines do not exist in this region). Accordingly, the second embodiment of the present invention provides a display device capable of achieving extreme brightness since it offers even better light efficiency using a light-collecting structure, compared to the first embodiment.

Figure 16:
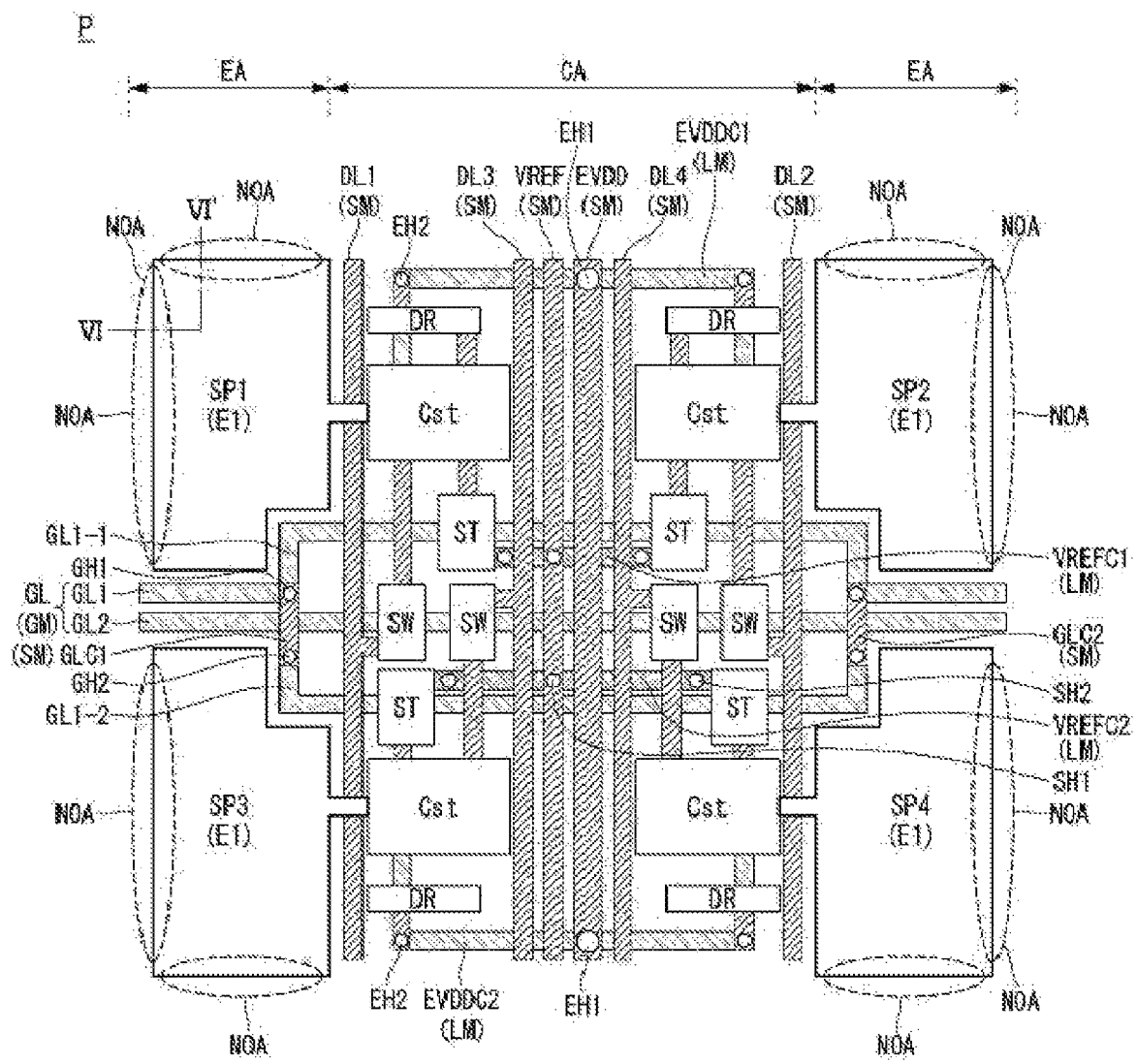
FIG. 16 is a plan view showing a display panel according to another embodiment of the present invention according to an embodiment.
Figure 17:
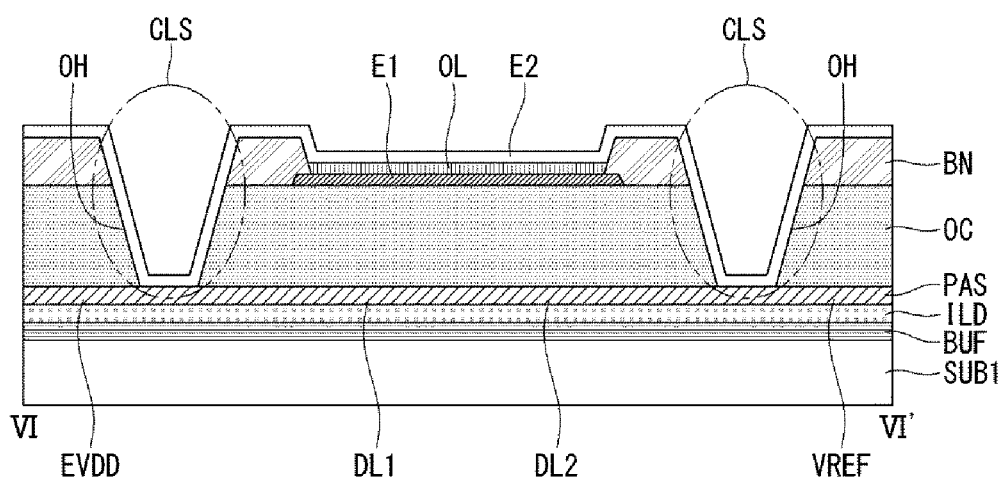
FIG. 17 is a cross-sectional taken along the line V-V' in FIG. 16 according to an embodiment.

FIG. 16 is a plan view showing a display panel according to a third embodiment of the present invention. FIG. 17 is a cross-sectional taken along the line V-V' in FIG. 16. In describing the third embodiment, an explanation of components substantially identical to those of the first embodiment will be omitted.

Referring to FIG. 16 in conjunction with FIG. 3, pixels P are arranged in the display area AA of the substrate SUB1. Each pixel P includes sub-pixels SP1 to SP4 each including an emitting portion EA and a circuit portion CA. An organic light-emitting diode (light-emitting element) is formed in the emitting portion EA, and a circuit including a switching transistor SW, sensing transistor ST, and driving transistor DR that drive the organic light-emitting diode is formed in the circuit portion CA. In each of the sub-pixels SP1 to SP4, the organic light-emitting diode located in the emitting portion EA emits light in response to operations of the switching and driving transistors DR located in the circuit portion CA.

In the third embodiment, the first and second sub-pixels SP1 and SP2 are placed adjacent to each other in the first direction, the third and fourth sub-pixels SP3 and SP4 are placed adjacent to each other in the first direction, the first and third sub-pixels SP1 and SP3 are placed adjacent to each other in the second direction, and the second and fourth sub-pixels SP2 and SP4 are placed adjacent to each other in the second direction. For example, the four sub-pixels can be arranged such that a light emitting area is located at each corner of a square or rectangular shaped region corresponding to the entire pixel unit, in which the corresponding wirings and circuit components are arranged in the center area, in an approximately cross-shaped region.

The emitting portions EA and the circuit portions CA are arranged in the first direction. The circuit portions CA of the sub-pixels SP1 to SP4 are placed at the center of the pixel P, and the emitting portions EA are placed on the outer side. The circuit portion CA of the first sub-pixel SP1 and the circuit portion CA of the second sub-pixel SP2 are placed adjacent to each other, and the emitting portion EA of the first sub-pixel SP1 and the emitting portion EA of the second sub-pixel SP2 are placed apart from each other, with the circuit portion CA of the first sub-pixel SP1 and the circuit portion CA of the second sub-pixel SP2 interposed between them. The circuit portion CA of the third sub-pixel SP3 and the circuit portion CA of the fourth sub-pixel SP4 are placed adjacent to each other, and the emitting portion EA of the third sub-pixel SP3 and the emitting portion EA of the fourth sub-pixel SP4 are placed apart from each other, with the circuit portion CA of the third sub-pixel SP3 and the circuit portion CA of the fourth sub-pixel SP4 interposed between them Each pixel P includes horizontal lines and vertical lines, through which a driving signal is applied to the sub-pixels SP1 to SP4. The pixels P can share the horizontal lines and the vertical lines. The vertical lines are disposed to stretch between the first and second sub-pixels SP1 and SP2 adjacent to each other in the first direction and between the third and fourth sub-pixels SP3 and SP4 adjacent to each other in the first direction.

The vertical lines can include a power supply line EVDD, a sensing line VREF, and first to fourth data lines DL1 to DL4. The vertical lines can refer to lines that stretch between sub-pixels SP1 to SP4 adjacent to each other in the first direction and extend in the second direction.

The first to fourth sub-pixels SP1 to SP4 can share one sensing line VREF and one power supply line EVDD. The sensing line VREF and the power supply line EVDD can extend in the second direction to stretch between the first and second sub-pixels SP1 and SP2 and between the third and fourth sub-pixels SP3 and SP4 and pass through the center of the pixel.

The sensing line VREF can be connected to the sensing transistors ST of the sub-pixels SP1 to SP4 through a sensing link line VREFC. The sensing link line VREFC is placed in the circuit portion CA. The sensing link line VREFC extends in the first direction and delivers a signal from the sensing line VREF extending in the second direction to the sub-pixels SP1 to SP4 arranged in the first direction. The sensing link line VREFC and the sensing line VREF are disposed on different layers, and are electrically connected via a first sensing contact hole SH1. The sensing link line VREFC and the source electrode of the sensing transistor ST are disposed on different layers, and are electrically connected via a second sensing contact hole SH2.

The sensing link line VREFC includes a first sensing link line VREFC1 and a second sensing link line VREFC2. The first sensing link line VREFC1 is connected to the first and second sub-pixels SP1 and SP2 adjacent to each other in the first direction, and delivers a signal from the sensing line VREF to the first sub-pixel SP1 and the second sub-pixel SP2. The second sensing link line VREFC2 is connected to the third and fourth sub-pixels SP3 and SP4 adjacent to each other in the first direction, and delivers a signal from the sensing line VREF to the third sub-pixel SP3 and the fourth sub-pixel SP4.

The power supply line EVDD can be connected to the driving transistors DR of the sub-pixels SP1 to SP4 through a power supply link line EVDDC. The power supply link line EVDDC is placed in the circuit portion CA. The power supply link line EVDDC extends in the first direction and delivers a signal from the power supply line EVDD extending in the second direction to the sub-pixels SP1 to SP4 arranged in the first direction. The power supply link line EVDDC and the power supply line EVDD are disposed on different layers, and are electrically connected via a first power supply contact hole EH1. The power supply link line EVDDC and the source electrode of the driving transistor DR are disposed on different layers, and are electrically connected via a second power supply contact hole EH2.

The power supply link line EVDDC includes a first power supply link line EVDDC1 and a second power supply link line EVDDC2. The first power supply link line EVDDC1 is connected to the first and second sub-pixels SP1 and SP2 adjacent to each other in the first direction, and delivers a signal from the power supply line EVDD to the first sub-pixel SP1 and the second sub-pixel SP2. The second power supply link line EVDDC2 is connected to the third and fourth sub-pixels SP3 and SP4 adjacent to each other in the first direction, and delivers a signal from the power supply line EVDD to the third sub-pixel SP3 and the fourth sub-pixel SP4.

The first to fourth data lines DL1 to DL4 can be connected to the switching transistors SW of the corresponding sub-pixels SP. The first and third data lines DL1 and DL3 can be disposed on one side with respect to the power supply line EVDD and sensing line VREF, adjacent to the first and third sub-pixels SP1 and SP3. The second and fourth data lines DL2 and DL4 can be disposed on the other side with respect to the power supply line EVDD and sensing line VREF, adjacent to the second and fourth sub-pixels SP2 and SP4.

Since the first sensing link line VREFC1, second sensing link line VREFC2, first power supply link line EVDDC1, and second power supply link line EVDDC2 which extend in the first direction intersect the sensing line VREF, power supply line EVDD, and data lines DL3 and DL4 which extend in the second direction, they are placed on different layers, with at least one insulating layer interposed between them, in order to prevent a short.

For example, as shown in the drawings, the first sensing link line VREFC1 and the second sensing link line VREFC2 can be placed on a corresponding layer of the same material LM as the light shielding layer, the first power supply link line EVDDC1 and the second power supply link line EVDD2 can be placed on a corresponding layer of the same material GM as the gate electrodes, and the sensing line VREF, the power supply line EVDD, and the data lines DL3 and DL4 can be placed on a corresponding layer of the same material SM as the source/drain electrodes.

In another example, the first sensing link line VREFC1, second sensing link line VREFC2, first power supply link line EVDDC1, and second power supply link line EVDDC2 can be formed of the same material since they do not intersect each other. For example, the first sensing link line VREFC1, second sensing link line VREFC2, first power supply link line EVDDC1, and second power supply link line EVDDC2 can be all formed of either the same material LM as the light shielding layer or the same material GM as the gate electrodes.

In another example, if the sensing line VREF is on a different layer from the power supply line EVDD and the first and second gate lines GL1 and GL2—for example, the sensing line VREF is formed on a corresponding layer of the same material LM as the light shielding layer, the sensing link line VREFC can be integral with the sensing line VREF. The sensing link line VREFC can be a part branching from the sensing line VREF.

The horizontal lines can include a first gate line GL1 and a second gate line GL2. The horizontal lines can be disposed to intersect the vertical lines. All the horizontal lines are disposed to stretch between the first sub-pixel SP1 and third sub-pixel SP3 adjacent to each other and between the second sub-pixel SP3 and fourth sub-pixel SP4 adjacent to each other. The horizontal lines can refer to lines that extend in the first direction.

The first gate line GL1 and the second gate line GL2 extend in the first direction. Since the first gate line GL1 and the second gate line GL2 apply a signal to the first and third sub-pixels SP1 and SP3 adjacent to each other in the second direction and the second and fourth sub-pixels SP2 and SP4 adjacent to each other in the second direction, one of the first gate line GL1 and second gate line GL2 may intersect the other.

Here, since the first gate line GL1 and the second gate line GL2 are formed of the same material GM, at least one of the first and second gate lines GL1 and GL2 can be divided up into two parts, and the two parts can be connected via a gate link line.

For example, the first gate line GL1 can include a (1-1)th gate line GL1-1 and a (1-2)th gate line GL1-2 which are placed on opposite sides, with the second gate line GL2 interposed between them. The (1-1)th gate line GL1-1 is connected to the sensing transistors of the first sub-pixel SP1 and second sub-pixel SP2. The (1-2)th gate line GL1-2 is connected to the sensing transistors of the third sub-pixel SP3 and fourth sub-pixel SP4. The (1-1)th gate line GL1-1 and the (1-2)th gate line GL1-2 are connected by gate link lines GLC1 and GLC2. That is, the (1-1)th and (1-2)th gate lines GL1-1 and GL1-2 are disposed on a different layer from the gate link lines GLC1 and GLC2, and one end and the other end of the gate link lines GLC1 and GLC2 are connected to the (1-1)th gate line GL1-1 and the (1-2)th gate line GL1-2, respectively, via first and second gate contact holes GH1 and GH2. The gate link lines GLC1 and GLC2 are disposed on a different layer from the second gate line GL2, and intersect the second gate line GL2. The gate link lines GLC1 and GLC2 can be formed of any one of the same materials SM as the source/drain electrodes, but are not limited thereto and can be formed of the same material LM as the light shielding layer.

The first electrodes E1 of the organic light-emitting didoes placed in the emitting portions EA of the sub-pixels SP1 to SP4 extend in the first direction where the circuit portions CA are located, and are electrically connected to the corresponding driving transistors DR and capacitors Cst.

In the third embodiment, with the above-described structure, no signal line is placed between first electrodes E1 adjacent to each other in at least one area. In an example, assuming that one pixel P and another pixel are adjacent to each other in the first direction, no signal line is placed between the first sub-pixel SP1 of the one pixel P and the second sub-pixel of the another pixel. In another example, assuming that one pixel P and another pixel are adjacent to each other in the second direction, no signal line is placed between the first sub-pixel SP1 of the one pixel P and the third sub-pixel of the another pixel.

Referring to FIG. 17, the display device according to the third embodiment of the present invention includes a light-collecting structure CLS formed between neighboring first electrodes E1 (e.g., between two light emitting areas of two different subpixels from two different pixel units that are adjacent to each other). The light-collecting structure CLS includes an open hole OH and a second electrode E2 received in the open hole OH.

The part of the second electrode E2 located in the open hole OH allows incident light to change the direction of travel to a preset direction. The direction of orientation can be a direction toward the bottom of the substrate SUB1, or a direction toward a color filter if any. That is, in the display device according to the third embodiment of the present invention, a part of the second electrode E2 inserted into the open hole OH can be used so that a beam of light that does not travel in the direction of orientation can easily change its path toward the bottom, among the light provided from the organic compound layer OL, or so that any light that may have been lost between the interfaces of the thin-film layers can be easily coupled out in the direction of the bottom of the substrate SUB1 towards the viewer's eyes.

In the third embodiment, unlike the first embodiment, at least one area NOA is provided where no signal line is placed between neighboring first electrodes E1. Accordingly, the third embodiment of the present invention provides a display device capable of achieving extreme brightness since it offers even better light efficiency using a light-collecting structure, compared to the first embodiment.

Through the above description, those skilled in the art will appreciate that various modifications and changes are possible, without departing from the scope and spirit of the invention. Therefore, the technical scope of the present invention should be defined by the appended claims rather than the detailed description of the specification.

What is claimed is:

1. A display device comprising:
   a plurality of sub-pixels including light emitting portions and circuit portions, and being configured to receive signals through vertical lines extending in a first direction and horizontal lines extending in a second direction intersecting the first direction;
   transistors disposed in the circuit portions;
   an overcoat layer covering the transistors;
   first electrodes disposed on the overcoat layer, each of the first electrodes being electrically connected to a corresponding light emitting portion among the light emitting portions and at least one of the transistors;
   a bank layer disposed on the first electrodes and including openings exposing the first electrodes;

an open hole disposed in a region between two adjacent first electrodes among the first electrodes and penetrating through the bank layer;
an organic compound layer disposed on the first electrodes; and
a second electrode disposed on the organic compound layer and extending to an area inside of the open hole,
wherein the vertical lines and the horizontal lines are absent from the region between the two adjacent first electrodes,
wherein the plurality of sub-pixels comprise a first sub-pixel, a second sub-pixel, a third sub-pixel and a fourth sub-pixel,
wherein a circuit portion of the first sub-pixel and a circuit portion of the second sub-pixel are adjacent to each other in the first direction,
wherein a circuit portion of the third sub-pixel and a circuit portion of the fourth sub-pixel are adjacent to each other in the first direction,
wherein a circuit portion of the first sub-pixel and a circuit portion of the third sub-pixel are adjacent to each other in the second direction,
wherein a circuit portion of the second sub-pixel and a circuit portion of the fourth sub-pixel are adjacent to each other in the second direction, and
wherein a first light emitting portion of the first sub-pixel, a second light emitting portion of the second sub-pixel, a third light emitting portion of the third sub-pixel, and a fourth light emitting portion of the fourth sub-pixel are arranged sequentially in the second direction.

2. The display device of claim 1, wherein the open hole penetrates through the overcoat layer.

3. The display device of claim 1, wherein the circuit portions of the plurality of sub-pixels are placed on one side with respect to a virtual axis extending in the second direction,
wherein the emitting portions of the plurality of sub-pixels are placed on the other side of the virtual axis, and
wherein the emitting portions of the plurality of sub-pixels are arranged sequentially in the second direction.

4. The display device of claim 1, wherein the transistors comprise a driving transistor and a switching transistor,
wherein the horizontal lines comprise a first gate line,
wherein the vertical lines comprise a power supply line and a data line,
wherein a gate electrode, a source electrode and a drain electrode of the switching transistor are connected to the first gate line, the data line, and the gate electrode of the driving transistor, respectively, and
wherein source and drain electrodes of the driving transistor are connected to the power supply line and the first electrode, respectively.

5. The display device of claim 4, further comprising:
a power supply link line extending in the first direction,
wherein the power supply line and the source electrode of the driving transistor are electrically connected with each other through the power supply link line, and
wherein the power supply line, the source electrode of the driving transistor, and the power supply link line are disposed on different layers, and are electrically connected with each other via power supply contact holes penetrating an insulating layer.

6. The display device of claim 4, wherein the transistors further comprise a sensing transistor,
wherein the horizontal lines further comprise a second gate line,
wherein the vertical lines further comprise a sensing line, and
wherein a gate electrode, a source electrode and a drain electrode of the sensing transistor are connected to the second gate line, the sensing line, and the first electrode, respectively.

7. The display device of claim 6, further comprising:
a sensing link line extending in the first direction,
wherein the sensing line and the source electrode of the sensing transistor are electrically connected with each other through the sensing link line, and
wherein the sensing line, the source electrode of the sensing transistor, and the sensing link line are disposed on different layers, and are electrically connected with each other via sensing contact holes penetrating an insulating layer.

8. The display device of claim 6, further comprising
a gate link line extending in the second direction,
wherein the first gate line or the second gate line is divided into two parts, which are electrically connected with each other via the gate link line, and
wherein the two parts and the gate link line are disposed on different layers, and are electrically connected with each other via gate contact holes penetrating an insulating layer.

9. The display device of claim 6, wherein the first gate line and the second gate line are disposed between two adjacent first electrodes among the first electrodes.

10. The display device of claim 6, wherein the data line, the power supply line, and the sensing line are all disposed on one side of a virtual axis extending in the second direction.

11. The display device of claim 1, wherein circuit portions of a pixel unit including at least three sub-pixels among the plurality of sub-pixels are disposed at a center region of the pixel unit, and emitting portions of the at least three sub-pixels are disposed outside of the circuit portions of the pixel unit.

12. A display device comprising:
a plurality of sub-pixels including light emitting portions and circuit portions, and being configured to receive signals through vertical lines extending in a first direction and horizontal lines extending in a second direction intersecting the first direction:
transistors disposed in the circuit portions;
an overcoat layer covering the transistors;
first electrodes disposed on the overcoat layer, each of the first electrodes being electrically connected to a corresponding light emitting portion among the light emitting portions and at least one of the transistors;
a bank layer disposed on the first electrodes and including openings exposing the first electrodes;
an open hole disposed in a region between two adjacent first electrodes among the first electrodes and penetrating through the bank layer;
an organic compound layer disposed on the first electrodes; and
a second electrode disposed on the organic compound layer and extending to an area inside of the open hole,
wherein the vertical lines and the horizontal lines are absent from the region between the two adjacent first electrodes,
wherein the plurality of sub-pixels comprise first, second, third and fourth sub-pixels,
wherein the first and second sub-pixels are disposed adjacent to each other in the first direction, wherein the third and fourth sub-pixels are disposed adjacent to each other in the first direction, wherein the first and third sub-pixels are disposed adjacent to each other in the second direction, wherein the second and fourth sub-pixels are disposed adjacent to each other in the second direction, and wherein the emitting portions and circuit portions of the first to fourth sub-pixels are arranged in the first direction.

13. The display device of claim 12, wherein the transistors comprise a driving transistor and a switching transistor, wherein the horizontal lines comprise a first gate line, and wherein the vertical lines comprise a power supply line and a data line, wherein a gate electrode, a source electrode and a drain electrode of the switching transistor are connected to the first gate line, the data line, and the gate electrode of the driving transistor, respectively, and wherein source and drain electrodes of the driving transistor are connected to the power supply line and the first electrode, respectively.

14. The display device of claim 13, further comprising:

a power supply link line extending in the first direction, wherein the power supply line and the source electrode of the driving transistor are electrically connected with each other through the power supply link line, and wherein the power supply line, the source electrode of the driving transistor, and the power supply link line are disposed on different layers, and electrically connected with each other via power supply contact holes penetrating an insulating layer.

15. The display device of claim 13, wherein the transistors further comprise a sensing transistor, wherein the horizontal lines further comprise a second gate line, wherein the vertical lines further comprise a sensing line, and wherein a gate electrode, a source electrode and a drain electrode of the sensing transistor are connected to the second gate line, the sensing line, and the first electrode, respectively.

16. The display device of claim 15, further comprising:

a sensing link line extending in the first direction, wherein the sensing line and the source electrode of the sensing transistor are electrically connected with each other through the sensing link line, and wherein the sensing line, the source electrode of the sensing transistor, and the sensing link line are disposed on different layers, and are electrically connected with each other via sensing contact holes penetrating an insulating layer.

17. The display device of claim 15, further comprising:

a gate link line extending in the second direction, wherein the first gate line or the second gate line includes two parts connected with each other via the gate link line, and wherein the two parts of the first gate line and the gate link line are disposed on different layers, and are electrically connected with each other via gate contact holes penetrating an insulating layer.

18. The display device of claim 15, wherein the first gate line and the second gate line are disposed between two adjacent first electrodes among the plurality of first electrodes.

19. The display device of claim 15, wherein the data line, the power supply line, and the sensing line are all disposed at a center region of the pixel unit.

* * * * *